United States Patent [19]
Brooks et al.

[11] Patent Number: 5,187,448
[45] Date of Patent: Feb. 16, 1993

[54] DIFFERENTIAL AMPLIFIER WITH COMMON-MODE STABILITY ENHANCEMENT

[75] Inventors: Todd L. Brooks; Mathew A. Rybicki, both of Austin, Tex.

[73] Assignee: Motorola, Inc., Schaumburg, Ill.

[21] Appl. No.: 829,822

[22] Filed: Feb. 3, 1992

[51] Int. Cl.$^5$ .............................................. H03F 3/45
[52] U.S. Cl. ..................................... 330/258; 330/253
[58] Field of Search ............... 330/253, 257, 258, 277, 330/288, 296, 252

[56] References Cited

U.S. PATENT DOCUMENTS 4,568,885 2/1986 McKenzie et al. ................. 330/253
4,573,020 2/1986 Whatley ............................. 330/258
5,117,199 5/1992 Wang et al. ..................... 330/258 X

OTHER PUBLICATIONS

"Integrated PCM Codec," by Ohri, K. and Callahan, M., in IEEE Journal of Solid State Circuits, vol. SC-14, No. 1, Feb. 1979, pp. 38-46.

Primary Examiner—Steven Mottola
Attorney, Agent, or Firm—Paul J. Polansky; Maurice (Jay) Jones

[57] ABSTRACT

A differential amplifier (60,60') enhances common-mode stability by making two nodes (86,87) of a first stage low common-mode impedance nodes and thus shifting a common-mode dominant pole from the two nodes (86,87). The first stage includes an input portion (80,80') and a differential load (110,110'). The input portion (80,80') provides first and second currents respectively to the differential load (110,110') in response to a differential input voltage. The first and second currents have a differential component and a common-mode component. The differential load (110,110') converts the differential and common-mode components of the first and second currents into differential and common-mode voltages, respectively, and provides a high impedance to the differential component and a low impedance to the common-mode component.

20 Claims, 3 Drawing Sheets

*FIG.1* —PRIOR ART—

DIFFERENTIAL AMPLIFIER WITH COMMON-MODE STABILITY ENHANCEMENT

FIELD OF THE INVENTION

This invention relates generally to amplifiers, and more particularly, to differential amplifiers with common-mode feedback.

BACKGROUND OF THE INVENTION

In analog circuitry, signals are often represented as differential voltages. A differential signal may be characterized as having a differential component and a common-mode component. A differential amplifier is very useful in processing differential signal voltages. If the differential amplifier also provides a differential output signal, it is known as a fully differential amplifier. The fully differential amplifier needs a mechanism to set the common-mode voltage to a desired reference voltage, such as an analog ground voltage, typically designated "$V_{AG}$". This mechanism is commonly a circuit which senses the common-mode component of the fully differential output signal, and provides a feedback signal to the amplifier proportional to the sensed difference between the two signals. This common-mode feedback mechanism thus prevents the common-mode voltage from drifting away from the desired reference voltage.

Known differential amplifiers are able to function with characteristics close to those of ideal voltage amplifiers, by having high input impedance, low output impedance, and stable frequency response. For some circuit applications, however, amplifier operation may become unstable. For example, some common-mode feedback circuits cause a node in the feedback circuit to compete with the output nodes of the amplifier gain stages as the dominant pole of the amplifier, causing instability in known amplifiers. Thus, new amplifiers are needed for this and other instability problems.

SUMMARY OF THE INVENTION

Accordingly, there is provided, in one form, a differential amplifier with common-mode stability enhancement comprising input means, differential load means, and means for providing first and second output voltages. The input means provides first and second currents respectively into first and second nodes. Differential components of the first and second currents are respectively proportional to positive and negative differences between first and second input signals. A common-mode component of the first and second currents is proportional to a common-mode feedback signal. The differential load means is coupled to the input means. The differential load means converts the differential and common-mode components of the first and second currents into differential and common-mode voltages at third and fourth nodes, respectively. The differential load means also provides a high impedance to the differential component and a low impedance to the common-mode component. The means for providing the first and second output voltages is coupled to the input means and to the differential load means, and provides the first and second output voltages respectively proportional to voltages at the third and fourth nodes, and provides the common-mode feedback voltage in response to a difference between a reference voltage and a sensed common-mode component of the first and second output voltages.

These and other features and advantages will be more clearly understood from the following detailed description taken in conjunction with the accompanying drawings.

DETAILED DESCRIPTION OF THE INVENTION

Figure 1:
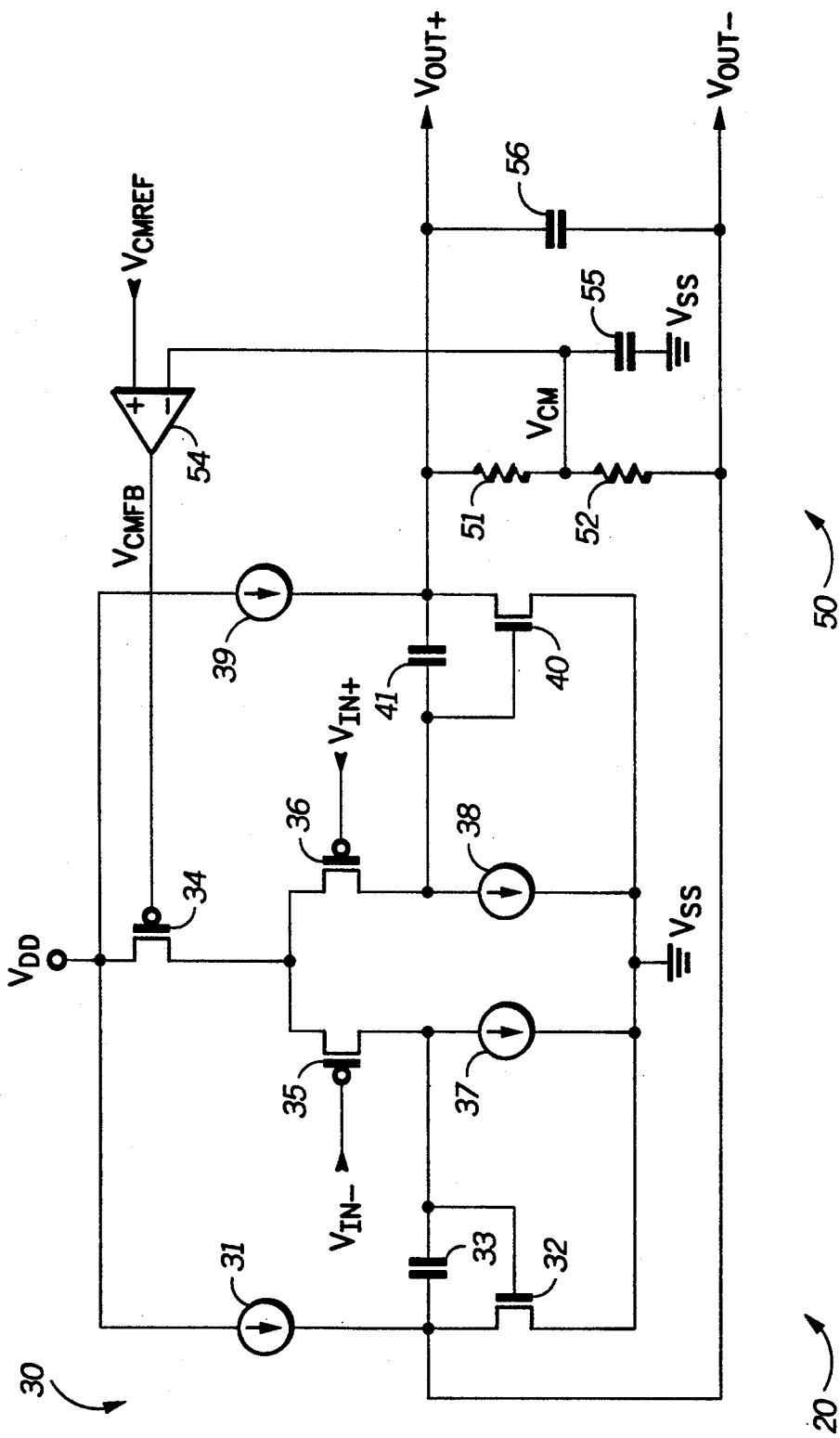
FIG. 1 illustrates in partial schematic form a differential amplifier with common-mode feedback known in the prior art.

FIG. 1 illustrates in partial schematic form a differential amplifier 20 with common-mode feedback known in the prior art. Differential amplifier 20 includes generally a differential portion 30 and a common-mode feedback circuit 50. FIG. 1 also illustrates a common-mode capacitor 55 and a differential-mode capacitor 56. Differential portion 30 includes a current source 31, an N-channel transistor 32, a capacitor 33, P-channel transistors 34, 35, and 36, current sources 37, 38, and 39, an N-channel transistor 40, and a capacitor 41. Current source 31 has a first terminal connected to a power supply voltage terminal labelled "$V_{DD}$", and a second terminal providing a negative output voltage signal labelled "$V_{OUT-}$". $V_{DD}$ is a more-positive power supply voltage terminal and is typically at five volts. Transistor 32 has a drain connected to the second terminal of current source 31, a gate, and a source connected to a power supply voltage terminal labelled "$V_{SS}$". $V_{SS}$ is a more-negative power supply voltage terminal and is typically at zero volts. Capacitor 33 has a first terminal connected to the second terminal of current source 31, and a second terminal connected to the gate of transistor 32. Transistor 34 has a source connected to $V_{DD}$, a gate for receiving a common-mode feedback signal labelled "$V_{CMFB}$", and a drain. Transistor 35 has a source connected to the drain of transistor 34, a gate for receiving a negative input signal voltage labelled "$V_{IN-}$", and a drain connected to the second terminal of capacitor 33. Transistor 36 has a source connected to the drain of transistor 34, a gate for receiving a positive input signal voltage labelled "$V_{IN+}$", and a drain. Current source 37 has a first terminal connected to the drain of transistor 35, and a second terminal connected to $V_{SS}$. Current source 38 has a first terminal connected to the drain of transistor 36, and a second terminal connected to $V_{SS}$. Current source 39 has a first terminal connected to $V_{DD}$, and a second terminal for providing a positive output signal labelled "$V_{OUT+}$". Transistor 40 has a drain connected to the second terminal of current source 39, a gate connected to the drain of transistor 36, and a source connected to $V_{SS}$. Capacitor 41 has a first terminal connected to the drain of transistor 36, and a second terminal connected to the second terminal of current source 39.

Common-mode feedback circuit 50 includes resistors 51 and 52, and an amplifier 54. Resistor 51 has a first terminal for receiving signal "$V_{OUT+}$", and a second terminal for providing a sensed common-mode voltage labelled "$V_{CM}$". Resistor 52 has a first terminal connected to the second terminal of resistor 51, and a second terminal for receiving signal $V_{OUT-}$. Amplifier 54 has a positive input terminal for receiving a reference voltage labelled "$V_{CMREF}$", a negative input terminal connected to the second terminal of resistor 51 and receiving signal $V_{CM}$ thereon, and an output terminal connected to the gate of transistor 34 and providing signal $V_{CMFB}$ thereon. Common-mode capacitor 55 has a first terminal connected to the second terminal of resistor 51, and a second terminal connected to $V_{SS}$. Differential-mode capacitor 56 has a first terminal connected to the drain of transistor 40 for receiving signal $V_{OUT+}$ thereon, and a second terminal connected to the drain of transistor 32 for receiving signal $V_{OUT-}$ thereon.

Here and in the following discussion, all transistors are assumed to be biased into saturation. Differential portion 30 is a standard, Miller-compensated two-stage fully differential amplifier with common-mode feedback. Differential portion 30 has two voltage gain stages with high-impedance outputs. The first stage includes transistors 34, 35, and 36 and current sources 37 and 38, providing outputs at the drains of transistors 35 and 36. Transistor 34, biased by voltage $V_{CMFB}$, functions as a controlled current source. Transistors 35 and 36 selectively divert the current provided by transistor 34 in response to a differential voltage between $V_{IN+}$ and $V_{IN-}$. The second stage includes current sources 31 and 39, and transistors 32 and 40, providing outputs at the drains of transistors 32 and 40.

Resistors 51 and 52 are equal-valued resistors which sense the common-mode between signals $V_{OUT+}$ and $V_{OUT-}$ as voltage $V_{CM}$. Voltage $V_{CM}$ is provided to the negative input terminal of differential amplifier 54. Differential amplifier 54 receives $V_{CMREF}$ at the positive input terminal. Amplifier 54 changes its output $V_{CMFB}$ in response to a difference between the voltages present at its inputs.

Each stage introduces a pole in the frequency response of differential portion 30. Capacitors 33 and 41 are connected between the high-impedance outputs of the two stages to stabilize the operation of differential portion 30. Both the differential-mode and the common-mode dominant poles are at the outputs of the first stage (at the drains of transistors 35 and 36), and both the differential-mode and the common-mode secondary poles are at the outputs of the second stage. However, in some cases, common-mode capacitor 55 is much larger than differential-mode capacitor 56. As the value of common-mode capacitor 55 becomes large in relation to the value of differential-mode capacitor 56, the secondary common-mode pole (at the drains of transistors 32 and 40) begins to compete with the dominant common-mode pole (at the drains of transistors 35 and 36), causing common-mode instability. Thus when the value of common-mode capacitor 55 is large, it is difficult to stabilize the common-mode operation of differential portion 30 while maintaining wide common-mode bandwidth. For this and other problems, new amplifiers are needed.

Figure 2:
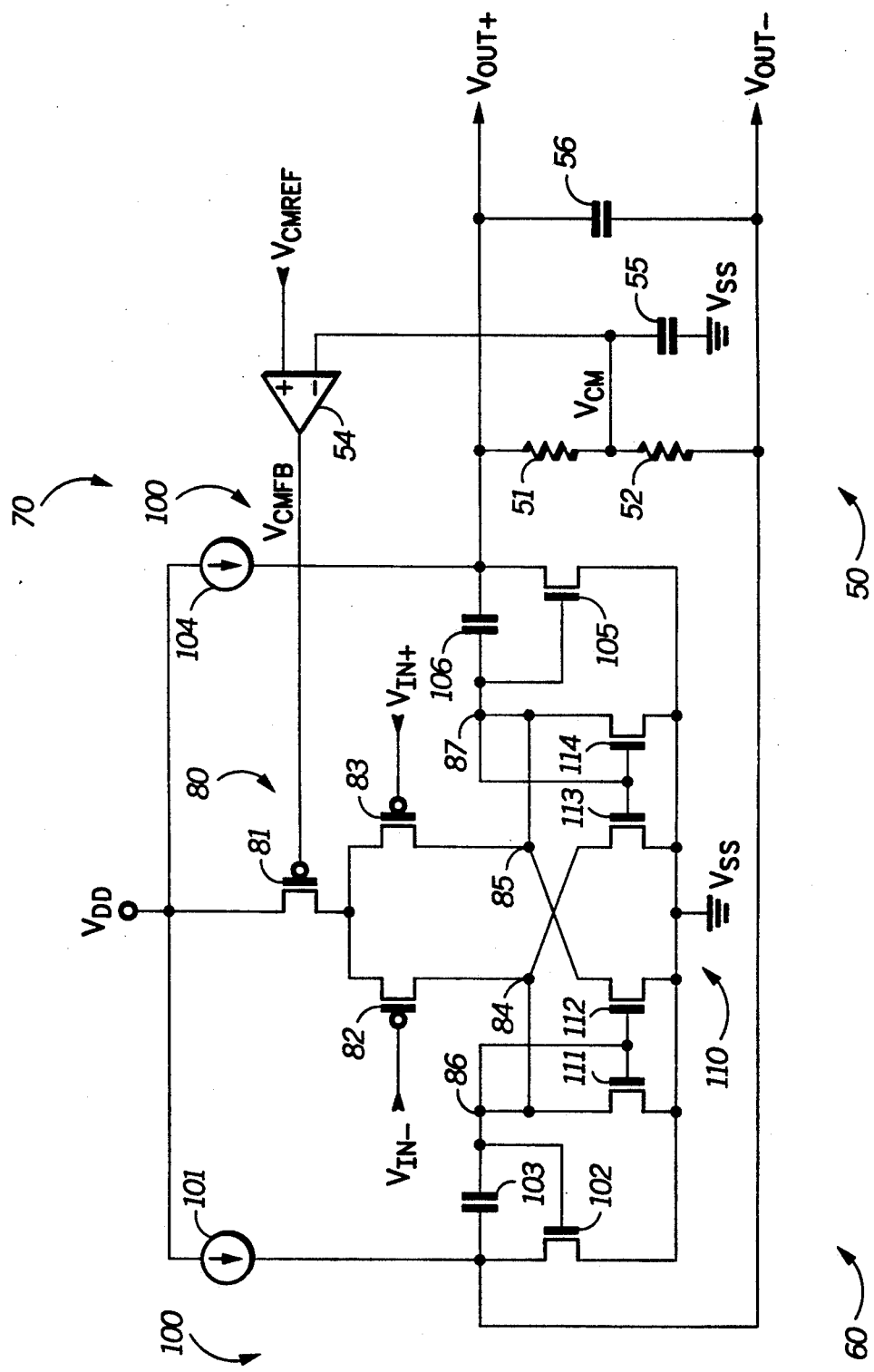
FIG. 2 illustrates in partial schematic form one embodiment of a differential amplifier with common-mode stability enhancement in accordance with the present invention.

FIG. 2 illustrates in partial schematic form one embodiment of a differential amplifier 60 with common-mode stability enhancement in accordance with the present invention. Differential amplifier 60 includes generally a differential amplifier 70 and common-mode feedback portion 50. FIG. 2 also illustrates common-mode capacitor 55 and differential-mode capacitor 56 as previously illustrated. Common-mode feedback portion 50, common-mode capacitor 55, and differential-mode capacitor 56 function as described previously. Differential portion 70 includes generally an input portion 80, an output portion 100, and a load portion 110. Differential portion 70 also includes power down circuitry for reducing power consumption during a power down condition. Such circuitry is known in the art and is thus omitted from FIG. 2.

Input portion 80 includes P-channel transistors 81, 82, and 83. Transistor 81 has a source connected to $V_{DD}$, a gate for receiving signal $V_{CMFB}$, and a drain. Transistor 82 has a source connected to the drain of transistor 81, a gate for receiving signal $V_{IN-}$, and a drain connected to a node 84. Transistor 83 has a source connected to the drain of transistor 81, a gate for receiving signal $V_{IN+}$, and a drain connected to a node 85. Two other nodes, 86 and 87, are associated with input portion 80. In input portion 80, node 86 is connected to node 84, and node 87 is connected to node 85.

Output portion 100 includes a current source 101, an N-channel transistor 102, a capacitor 103, a current source 104, an N-channel transistor 105, and a capacitor 106. Current source 101 has a first terminal connected to $V_{DD}$, and a second terminal providing signal $V_{OUT-}$ thereon. Transistor 102 has a drain connected to the second terminal of current source 101, a gate connected to node 86, and a source connected to $V_{SS}$. Capacitor 103 has a first terminal connected to the second terminal of current source 101, and a second terminal connected to node 86. Current source 104 has a first terminal connected to $V_{DD}$, and a second terminal providing signal $V_{OUT+}$ thereon. Transistor 105 has a drain connected to the second terminal of current source 104, a gate connected to node 87, and a source connected to $V_{SS}$. Capacitor 106 has a first terminal connected to node 87, and a second terminal connected to the second terminal of current source 104.

Load portion 110 includes N-channel transistors 111-114. Transistor 111 has a drain connected to node 84, a gate connected to node 86, and a source connected to $V_{SS}$. Transistor 112 has a drain connected to node 85, a gate connected to node 86, and a source connected to $V_{SS}$. Transistor 113 has a drain connected to node 84, a gate connected to node 87, and a source connected to $V_{SS}$. Transistor 114 has a drain connected to node 85, a gate connected to node 87, and a source connected to $V_{SS}$.

Differential portion 70, like differential portion 30, is also a Miller-compensated two-stage fully differential amplifier. The first stage includes input portion 80 and load portion 110, and the second stage is output portion 100. However, differential portion 70 enhances common-mode stability by moving the common-mode pole that would normally reside at nodes 86 and 87 to frequencies much greater than that of other competing poles in the common-mode feedback loop. Thus, the common-mode loop is easier to stabilize. This enhancement occurs because load portion 110 reduces the common-mode output impedance at the first amplifier stage.

To analyze the effect of including load portion 110 in differential portion 70, it is helpful to separately analyze the common-mode and differential components of currents flowing into load portion 110. In the preferred embodiment, the gates of transistors 111-114 have the same size. Thus the common-mode component of the currents are distributed equally through transistors 111-114, making the voltages at nodes 86 and 87 substantially equal. Since the common-mode voltages at nodes 86 and 87 are equal, the effective common-mode impedance is equivalent to that of a gate-to-drain-connected (diode-connected) transistor.

The differential component of the current distributes in such a way that the currents in transistors 111 and 112 are equal and opposite to the currents in transistors 113 and 114 (which are also equal). The differential currents in transistors 111 and 112 are equal because transistors 111 and 112 form a current mirror. Likewise, the differential currents in transistors 113 and 114 are equal because transistors 113 and 114 form a current mirror. Thus, the differential component of the current conducted from node 84 (by transistors 111 and 113) is equal in magnitude and opposite in direction to that conducted from node 85 (by transistors 112 and 114). All of the differential component of the current flowing into the drain of transistor 111 is provided by the differential component of the current of transistor 113. Similarly, all of the differential component of the current flowing into the drain of transistor 114 is provided by the differential component of the current of transistor 112. This in effect creates a positive feedback, enhancing the differential impedance at nodes 86 and 87. Thus, the differential impedance looking into nodes 84 and 85 is very high.

Figure 3:
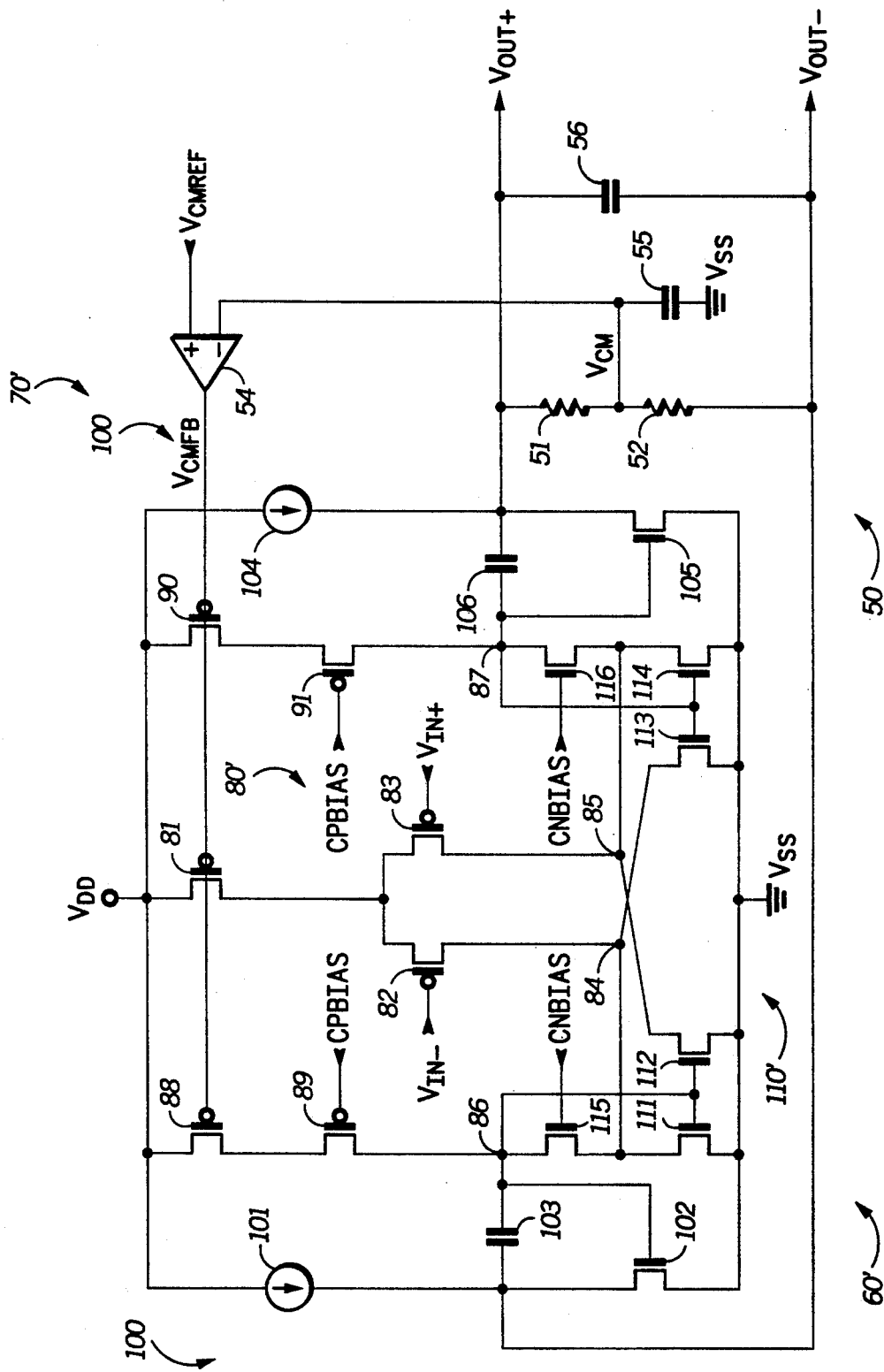
FIG. 3 illustrates in partial schematic form another embodiment of a differential amplifier with common-mode stability enhancement in accordance with a preferred embodiment of the present invention.

FIG. 3 illustrates in partial schematic form another embodiment of a differential amplifier with common-mode stability enhancement 60' in accordance with a preferred embodiment of the present invention. Differential amplifier 60' includes common-mode feedback portion 50 and a differential portion 70'. FIG. 3 also illustrates common-mode capacitor 55 and differential-mode capacitor 56 as previously illustrated in FIGS. 1 and 2. Differential amplifier 70' includes an input portion 80', output portion 100 as previously illustrated in FIG. 2, and load portion 110'. Differential portion 70' also includes power down circuitry for reducing power consumption during the power down condition. Such circuitry is known in the art and is thus omitted from FIG. 3.

Input portion 80' includes P-channel transistors 81–83 and 88–91. Elements in common with circuit 80 of FIG. 2 retain their respective reference numbers. Input portion 80' has four additional transistors, 88–91. Transistor 88 has a source connected to $V_{DD}$, a gate for receiving signal $V_{CMFB}$, and a drain. Transistor 89 has a source connected to the drain of transistor 88, a gate for receiving a bias voltage labelled "CPBIAS", and a drain connected to node 86. Transistor 90 has a source connected to $V_{DD}$, a gate for receiving signal $V_{CMFB}$, and a drain. Transistor 91 has a source connected to the drain of transistor 90, a gate for receiving bias voltage CPBIAS, and a drain connected to node 87. CPBIAS is a bias voltage sufficient to bias P-channel transistors 89 and 91 into saturation.

Load portion 110' includes N-channel transistors 111–114, and N-channel cascode transistors 115 and 116. Elements in common with load portion 110 of FIG. 2 retain their respective reference numbers. In load portion 110', transistor 115 has a drain connected to node 86, a gate for receiving a bias voltage labelled "CNBIAS", and a source connected to node 84. Transistor 116 has a drain connected to node 87, a gate for receiving bias voltage CNBIAS, and a source connected to node 85. CNBIAS is a bias voltage sufficient to bias N-channel transistors 115 and 116 into saturation.

Differential portion 70' is similar to differential portion 70, but there are two principal differences between the two. First, in load portion 110', cascode transistors 115 and 116 increase the differential output impedance at nodes 86 and 87, while not substantially affecting low common-mode output impedance as in FIG. 2. Second, transistors 88–91, in addition to transistor 81, provide a common-mode feedback network to change the magnitude of the common-mode component of current provided into nodes 86 and 87 in response to signal $V_{CMFB}$.

Amplifiers 70 and 70' enhance common-mode stability by moving the common-mode pole at nodes 86 and 87 to a frequency much greater than that of the other competing common-mode poles typically located at the output of the second amplification stage or at the output of amplifier 54. The common-mode loop of this amplifier may easily be stabilized in two ways. First, giving amplifier 54 low output impedance broadbands the pole (moves the pole frequency to a higher frequency) at its output. Second, using a Miller capacitor to provide feedback from the second terminal of resistor 51 to the output of amplifier 54 broadbands the pole at the output of output portion 100 and forces the pole at the output of amplifier 54 to become dominant.

While the invention has been described in the context of a preferred embodiment, it will be apparent to those skilled in the art that the present invention may be modified in numerous ways and may assume many embodiments other than that specifically set out and described above. For example, circuitry for reducing power consumption of the amplifier during a power down mode (not shown in FIGS. 2 and 3) is commonly used and well-known. Furthermore, FIGS. 1–3 illustrate a common-mode capacitor 55 between the second terminal of resistor 51 and power supply voltage terminal $V_{SS}$. In other embodiments, differential amplifiers 60 or 60' may appropriately be used when a large common-mode capacitance exists between the second terminal of resistor 51 and some other fixed-voltage terminal. Note also that different transistor types and different power supply voltages may be used. Accordingly, it is intended by the appended claims to cover all modifications of the invention which fall within the true spirit and scope of the invention.

We claim:

1. A differential amplifier with common-mode stability enhancement comprising:

input means for providing first and second currents respectively into first and second nodes, differential components of said first and second currents respectively proportional to positive and negative differences between first and second input signals, a common-mode component of said first and second currents proportional to a common-mode feedback signal;

differential load means coupled to said input means, for converting said differential and common-mode components of said first and second currents into differential and common-mode voltages at third and fourth nodes, respectively, and for providing a high impedance to said differential component and a low impedance to said common-mode component; and means coupled to said input means and to said differential load means, for providing first and second output voltages respectively proportional to voltages at said third and fourth nodes, and for providing said common-mode feedback signal in response to a difference between a reference voltage and a sensed common-mode component of said first and second output voltages;

said differential load means comprising:
- a first transistor, having a first current electrode coupled to said first node, a control electrode coupled to said third node, and a second current electrode coupled to a power supply voltage terminal;
- a second transistor having a first current electrode coupled to said second node, a control electrode coupled to said third node, and a second current electrode coupled to said power supply voltage terminal;
- a third transistor having a first current electrode coupled to said first node, a control electrode coupled to said fourth node, and a second current electrode coupled to said power supply voltage terminal; and
- a fourth transistor having a first current electrode coupled to said second node, a control electrode coupled to said fourth node, and a second current electrode coupled to said power supply voltage terminal.

2. The differential amplifier of claim 1 wherein said providing means comprises:
- a first current source having a first terminal coupled to a first power supply voltage terminal, and a second terminal;
- a first transistor having a first current electrode coupled to said second terminal of said first current source, a control electrode coupled to said third node, and a second current electrode coupled to a second power supply voltage terminal;
- a second current source having a first terminal coupled to said first power supply voltage terminal, and a second terminal; and
- a second transistor having a first current electrode coupled to said second terminal of said second current source, a control electrode coupled to said fourth node, and a second current electrode coupled to a second power supply voltage terminal.

3. The differential amplifier of claim 2 wherein said providing means further comprises:
- a first capacitor having a first terminal coupled to said second terminal of said first current source, and a second terminal coupled to said third node; and
- a second capacitor having a first terminal coupled to said second terminal of said second current source, and a second terminal coupled to said fourth node.

4. The differential amplifier of claim 1 wherein said input means comprises:
- current source means having a first terminal coupled to a first power supply voltage terminal, and a second terminal, and providing a current from said second terminal proportional to said common-mode feedback signal;
- a first transistor having a first terminal coupled to said second terminal of said current source means, a control electrode for receiving said first signal, and a second current electrode coupled to said first node and providing said first current thereinto; and
- a second transistor having a first current electrode coupled to said second terminal of said first current source, a control electrode for receiving said second signal, and a second current electrode coupled to said second node and providing said second current thereinto.

5. The differential amplifier of claim 1 wherein said load means further comprises:
- first cascode means for coupling said first node to said third node and for increasing an output impedance at said third node; and
- second cascode means for coupling said second node to said fourth node and for increasing an output impedance at said fourth node.

6. The differential amplifier of claim 5 wherein said first cascode means comprises a fifth transistor having a first current electrode coupled to said third node, a control electrode for receiving a bias signal, and a second current electrode coupled to said first node.

7. The differential amplifier to claim 6 wherein said bias signal biases said fifth transistor into saturation.

8. A differential amplifier with a common-mode stability enhancement comprising:
- input means for providing first and second currents respectively into first and second nodes, respectively in response to positive and negative differences between first and second input signals, and for adjusting a magnitude of a common-mode component of said first and second currents in response to a common-mode feedback signal;
- output means coupled to said input means, for providing first and second output signals proportional respectively voltages at third and fourth nodes;
- common-mode feedback means coupled to said input means and to said output means, for sensing a common-mode voltage at said third and fourth nodes, and for providing said common-mode feedback signal in response to a difference between said common-mode voltage and a reference voltage; and
- differential load means coupled to said input means, for providing voltages at said first and second nodes proportional respectively to said first and second differential currents, and for coupling said first and second nodes respectively to said third and fourth nodes, comprising:
  - a first transistor, having a first current electrode coupled to said first node, a control electrode coupled to said third node, and second current electrode coupled to a power supply voltage terminal;
  - a second transistor having a first current electrode coupled to said second node, a central electrode coupled to said third node, and a second current electrode coupled to said power supply voltage terminal;
  - a third transistor having a first current electrode coupled to said first node, a control electrode coupled to said fourth node, and a second current electrode coupled to said power supply voltage terminal; and
  - a fourth transistor having a first current electrode coupled to to said second node, a control electrode coupled to said fourth node, and a second current electrode coupled to said power supply voltage terminal.

9. The differential amplifier of claim 8 wherein said differential load means further comprises:
- first cascode means for coupling said first node to said third node and for increasing an output impedance at said third node; and
- second cascode means for coupling said second node to said fourth node and for increasing an output impedance at said fourth node.

10. The differential amplifier of claim 9 wherein said first cascode means comprises a fifth transistor having a first current electrode coupled to said third node, a control electrode for receiving a bias signal, and a second current electrode coupled to said first node.

11. The differential amplifier of claim 10 wherein said bias signal biases said fifth transistor into saturation.

12. A differential load for receiving differential currents at first and second nodes and for providing differential output voltages at third and fourth nodes comprising:
   a first transistor having a first current electrode coupled to the first node, a control electrode coupled to the third node and a second current electrode coupled to a power supply voltage terminal;
   a second transistor having a first current electrode coupled to the second node, a control electrode coupled to the third node and a second current electrode coupled to said power supply voltage terminal;
   a third transistor having a first current electrode coupled to the first node, a control electrode coupled to the fourth node and a second power current electrode coupled to said power supply voltage terminal;
   a fourth transistor having a first current electrode coupled to the second node, a control electrode coupled to the fourth node and a second current electrode coupled to said power supply voltage terminal;
   a first cascode element for coupling the first node to the third node to increase an output impedance at the third node; and a second cascode elements for coupling the second node to the
   fourth node to increase an output impedance at the fourth node.

13. The differential load of claim 12 wherein said first cascode element comprises a fifth transistor having a first current electrode coupled to the third node, a control electrode for receiving a bias signal, and a second current electrode coupled to the first node.

14. The differential load of claim 13 wherein said biases said fifth transistor into saturation.

15. The differential load of claim 14 wherein first, second, third, and fourth transistor are each MOS transistors.

16. A differential amplifier with common-mode stability enhancement comprising:
   input means for providing first and second differential currents respectively to first and second nodes, respectively in response to positive and negative differences between first and second input voltages, a magnitude of said first and second differential currents proportional to a common-mode feedback signal;
   differential load means providing first and second differential voltages proportional to said first and second differential currents, respectively;
   output means coupled to said input means and to said load means, for providing first and second output signals proportional to said first and second differential voltages, respectively; and
   common-mode feedback means, for sensing a common-mode voltage at said first and second nodes, and for providing said common-mode feedback signal proportional to the difference between said sensed common-mode voltage and a reference voltage;
   said differential load means comprising:
      a first transistor having a first current electrode coupled to said first node, a control electrode coupled to said first current electrode thereof, and a second current electrode coupled to a power supply voltage terminal;
      a second transistor having a first current electrode coupled to said second node, a control electrode coupled to said first current electrode of said first transistor, and a second current electrode coupled to said power supply voltage terminal;
      a third transistor having a first current electrode coupled to said first node, a control electrode coupled to said second node, and a second current electrode coupled to said power supply voltage terminal; and
      a fourth transistor having a first current electrode coupled to said second node, a control electrode coupled to said first current electrode thereof, and a second current electrode coupled to said power supply voltage terminal.

17. The differential amplifier of claim 16, wherein said first, second, third, and fourth transistors are each MOS transistors.

18. A differential amplifier with common-mode stability enhancement comprising:
   an input stage having first and second input terminals respectively receiving first and second voltages thereon, and first and second output terminals respectively coupled to first and second nodes and providing first and second currents respectively thereinto;
   a differential load having first and second input terminals respectively coupled to said first and second nodes, and first and second output terminals respectively providing third and fourth voltages to third and fourth nodes, said differential load comprising:
      a first transistor, having a first current electrode coupled to said first node, a control electrode coupled to said third node, and a second current electrode coupled to a power supply voltage terminal;
      a second transistor having a first current electrode coupled to said second node, a control electrode coupled to said third node, and a second current electrode coupled to said power supply voltage terminal;
      a third transistor having a first current electrode coupled to said first node, a control electrode coupled to said fourth node, and a second current electrode coupled to said power supply voltage terminal; and
      a fourth transistor having a first current electrode coupled to said second node, a control electrode coupled to said fourth node, and a second current electrode coupled to said power supply voltage terminal.

19. The differential amplifier of claim 18 wherein said differential load further comprises:
   first cascode means for coupling said first node to said third node and for increasing an output impedance at said third node; and
   second cascode means for coupling said second node to said fourth node and for increasing an output impedance at said fourth node.

20. The differential load of claim 18 further comprising an output stage having first and second input terminals coupled to said third and fourth nodes, and first and second output terminals respectively providing first and second output voltages thereof.

* * * * *

UNITED STATES PATENT AND TRADEMARK OFFICE
CERTIFICATE OF CORRECTION

PATENT NO. : 5,187,448

DATED : February 16, 1993

INVENTOR(S) : Todd L. Brooks; Mathew A. Rybicki

It is certified that error appears in the above-identified patent and that said Letters Patent is hereby corrected as shown below:

Column 6, line 63, after "; and" start --means coupled to said input . . .--
on a new line
Column 9, line 23, delete [power]
Column 9, line 33, after "; and" start --a second cascode elements . . .--
on a new line
Column 9, line 45, change "transistor" to--transistors--

Signed and Sealed this

Eleventh Day of January, 1994

Attest:

BRUCE LEHMAN

*Attesting Officer*    *Commissioner of Patents and Trademarks*